(12) United States Patent
Elahi et al.

(10) Patent No.: US 7,876,856 B2
(45) Date of Patent: Jan. 25, 2011

(54) QUADRATURE RECEIVER WITH CORRECTION ENGINE, COEFFICIENT CONTROLLER AND ADAPTATION ENGINE

(75) Inventors: Imtinan Elahi, Richardson, TX (US); Khurram Muhammad, Dallas, TX (US)

(73) Assignee: Texas Instrumentals Incorporated, Dallas, TX (US)

( * ) Notice: Subject to any disclaimer, the term of this patent is extended or adjusted under 35 U.S.C. 154(b) by 1483 days.

(21) Appl. No.: 11/159,727

(22) Filed: Jun. 23, 2005

(65) Prior Publication Data

US 2006/0291590 A1    Dec. 28, 2006

(51) Int. Cl.
*H03K 9/00*    (2006.01)
(52) U.S. Cl. .................. 375/316; 375/324; 375/261; 375/320; 375/285; 379/406.08; 714/48; 714/796; 381/318; 381/74
(58) Field of Classification Search ........... 379/406.08; 375/350, 296, 285; 714/48, 796; 381/318, 381/74; 455/427

See application file for complete search history.

(56) References Cited

U.S. PATENT DOCUMENTS

| | | | | |
|---|---|---|---|---|
| 5,664,011 | A * | 9/1997 | Crochiere et al. | 379/406.08 |
| 7,346,175 | B2 * | 3/2008 | Hui et al. | 381/74 |
| 2002/0010896 | A1 * | 1/2002 | Huttunen | 714/796 |
| 2002/0064291 | A1 * | 5/2002 | Kates et al. | 381/318 |
| 2002/0137510 | A1 * | 9/2002 | Sims et al. | 455/427 |
| 2003/0053647 | A1 * | 3/2003 | Kates | 381/318 |
| 2004/0193965 | A1 * | 9/2004 | Coersmeier | 714/48 |
| 2005/0089115 | A1 * | 4/2005 | Hartmann et al. | 375/285 |
| 2005/0163250 | A1 * | 7/2005 | McCallister | 375/296 |
| 2006/0056554 | A1 * | 3/2006 | Lin et al. | 375/350 |

OTHER PUBLICATIONS

Lawrence Der, Behzad Razavi, "A 2-GHz CMOS Image Reject Receiver with LMS Calibration", IEEE Journal of Solid-State Circuits, vol. 38, No. 2, Feb. 2003.

Farbod Behbahani, Yoji Kishigami, John Leete, Asad A. Abidi, "CMOS Mixers and Polyphase Filters for Large Image Rejection", IEEE Jounal of Solid-State Circuits, vol. 36, No. 6, Jun. 2001.

Isis Mikhael, Wasfy B. Mikhael, "Adaptive IQ Mismatch Cancellation for Quadrature IF Receivers", submitted to IEEE Midwest Symposium on Circuits, Aug. 2002.

Mikko Valkama, Markku Renfors, "Advanced DSP for I/Q Imbalance Compensation in a Low-IF Receiver", IEEE International Conference on Communications, 2000, pp. 768-772, Jun. 2000.

Jan Tubbax, Boris Côme, Liestbet Van der Perre, Stéphane Donnay, Marc Engels, Claude Desset, "Joint Compensation of IQ Imbalance and Phase Noise", Vehicular Technology Conference, 2003, pp. 1605-1609, Apr. 2003.

(Continued)

*Primary Examiner*—Sudhanshu C Pathak
(74) *Attorney, Agent, or Firm*—Lawrence J. Bassuk; W. James Brady; Frederick J. Telecky, Jr.

(57) ABSTRACT

Methods and apparatus to compensate for I/Q mismatch in quadrature receivers are disclosed. An example apparatus disclosed herein comprises a correction engine using first filter coefficients to compensate for I/Q mismatch present in a received quadrature signal; an adaptation engine to adapt second filter coefficients based on I/Q mismatch present in the received quadrature signal; and coefficient controller to occasionally adjust the first filter coefficients based on the second filter coefficients.

7 Claims, 5 Drawing Sheets

OTHER PUBLICATIONS

K.P. Pun, J.E. Franca, C. Azeredo-Leme, "The Correction of Frequency-Dependent I/Q Mismatches in Quadrature Receivers by Adaptive Signal Separation", Proceedings of 4$^{th}$ International Conference on ASIC, 2001, pp. 424-427.

Li Yu and W.M. Snelgrove, "A Novel Adaptive Mismatch Cancellation System for Quadrature IF Radio Receivers", IEEE Transactions on Circuits and Systems:-II: Analog and Digital Signal Processing, vol. 46, No. 6, pp. 789-801, Jun. 1999.

D.V. Compernolle and S.V. Gerven, "Signal Separation in a Symmetric Adaptive Noise Canceller by Output Decorrelation", in Proceedings of the International Conference on Acoustic Speech Signal Processing, vol. IV, pp. 221-224, Mar. 1992.

S.V. Gerven and D.V. Compernolle, "Signal Separation by Symmetric Adaptive Decorrelation: stability, convergence and uniqueness," IEEE Transactions of Signal Processing, vol. 43, No. 7, pp. 1602-1612, Jul. 1992.

Elahi et al., I/Q Mismatch Compensation in a 90nm Low-IF CMOS Receiver, Presentation, IEEE International Solid-State Circuits Conference, 2005, Session 29, 2005.

Elahi et al., I/Q Mismatch Compensation in a 90nm Low-IF CMOS Receiver, IEEE International Solid-State Circuits Conference, 2005, Session 29, 2005, pp. 19-21.

Kazuo Ochiai, Takashi Araseki, and Takashi Ogihara, "Echo Canceler with Two Echo Path Models," IEEE Transactions on Communication, vol. COM-25, No. 6, Jun. 1977, 7 pages.

* cited by examiner

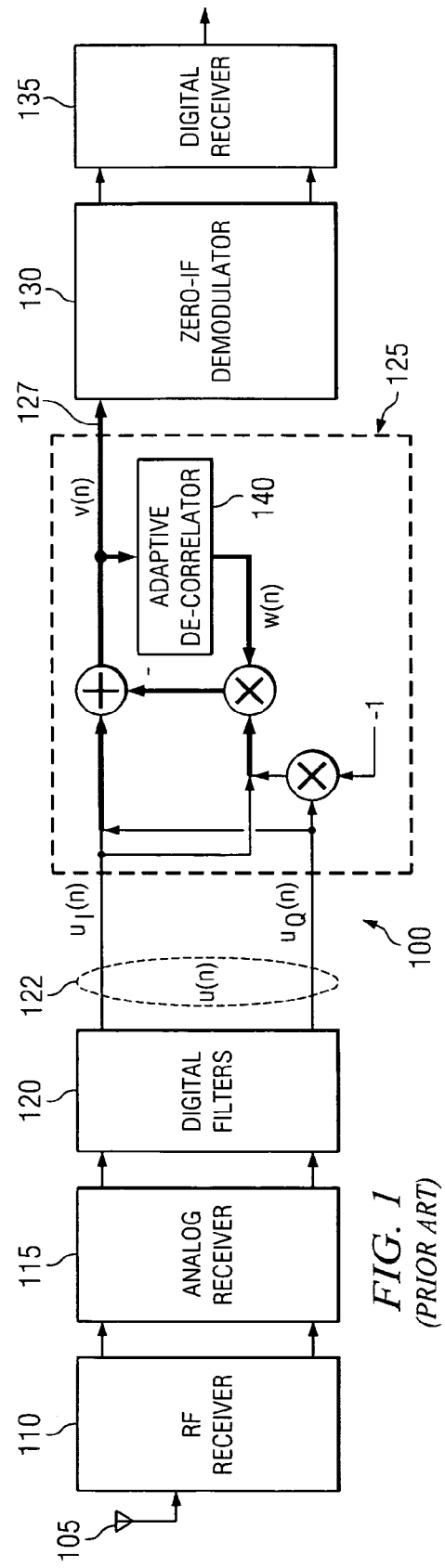
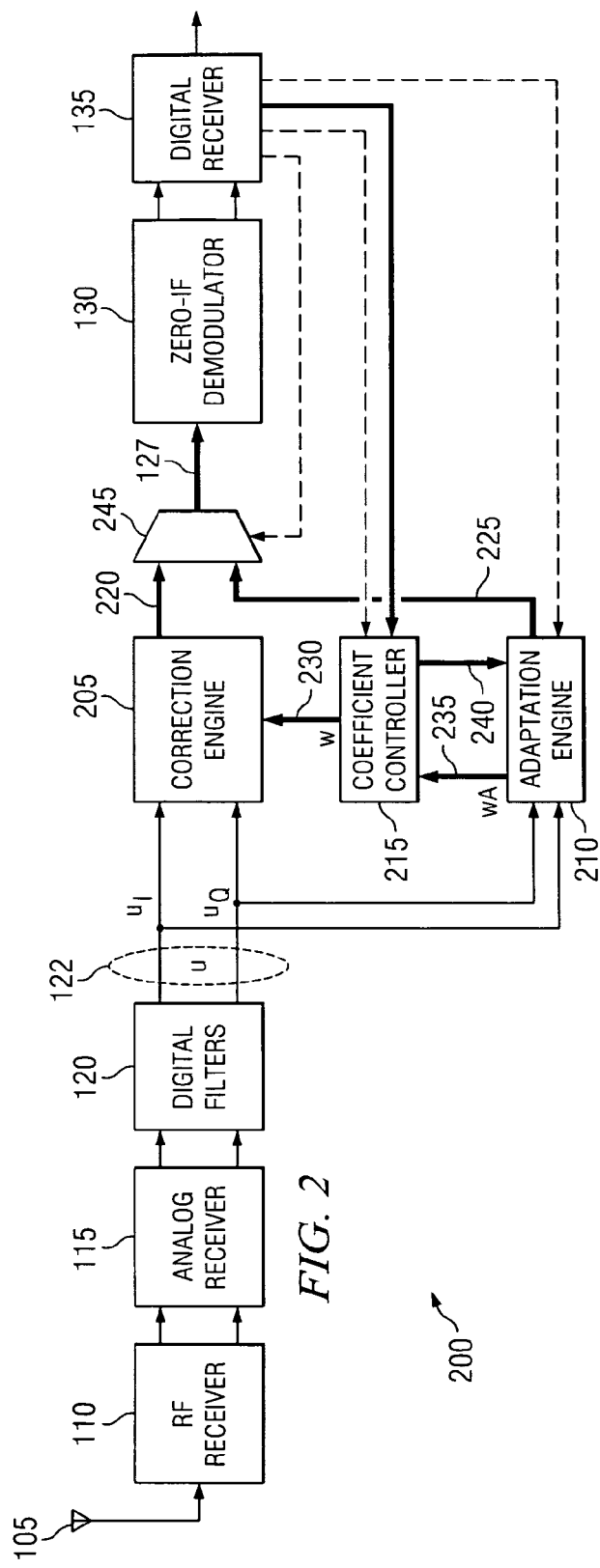
FIG. 1 (PRIOR ART)
FIG. 2

QUADRATURE RECEIVER WITH CORRECTION ENGINE, COEFFICIENT CONTROLLER AND ADAPTATION ENGINE

FIELD OF THE DISCLOSURE

This disclosure relates generally to quadrature receivers, and, more particularly, to methods and apparatus to compensate for in-phase/quadrature (I/Q) mismatch in quadrature receivers.

BACKGROUND

Low intermediate frequency (IF) receiver architectures are attractive due to their improved immunity to DC offsets and flicker noise (i.e., a well known low frequency phenomenon, often called 1/f noise). However, gain and phase mismatches between the in-phase (i.e., I) and quadrature (i.e., Q) paths of a quadrature low-IF receiver (i.e., I/Q mismatch) can result in an image of a nearby interferer falling into a signal of interest. For example, a low-IF Groupe Spéciale Mobile (GSM) receiver requires an image rejection ratio (IRR) of at least 32 decibels (dB) for an IF of 100 kilohertz (kHz) and 50 dB for an IF of 200 kHz. However, typical implementations of such low-IF receivers may only guarantee 25-35 dB of IRR. Thus, low-IF receivers typically require some form of I/Q mismatch compensation.

FIG. 1 is a block diagram illustration of a portion of an example prior-art low-IF quadrature receiver 100 including I/Q mismatch compensation. The quadrature receiver 100 contains an antenna 105 used to receive a wireless radio frequency (RF) signal from a transmitter (e.g., wireless base station) (not shown). To process the RF signal received from the transmitter via the antenna 105, the example quadrature receiver 100 includes a RF receiver 110 that, among other things, demodulates the RF band signal received from the antenna 105 to form quadrature analog low-IF or base-band signals.

To handle conversion from the analog domain to the digital domain, the example of FIG. 1 further includes an analog low-IF/base-band receiver 115. The analog low-IF/base-band receiver 115 includes low-pass filters (not shown), analog-to-digital (A/D) converters (not shown), etc. to transform the quadrature analog IF band signals received from the RF receiver 110 into quadrature digital IF band signals. To further reduce the sampling rate required to represent the quadrature digital IF band signals, the quadrature receiver 100 includes digital filters 120 that include a plurality of digital filters (not shown) and sample rate decimators (not shown). For example, in a low-IF GSM receiver, the input sampling rate of the digital filters 120 could be 430-500 million samples per second (Msps) with an output sampling rate of 1.08333 Msps (i.e., 4 times the GSM baud rate of 270.833 kilo baud per second (Kbs)).

In the example quadrature receiver 100 of FIG. 1, in-phase and quadrature components 122 (i.e., quadrature signals that make up the signal u(n) 122) from the digital filters 120 are provided to an I/Q mismatch compensator 125. The I/Q mismatch compensator 125 adaptively filters the signal u(n) 122 to compensate for I/Q mismatch present in the signal u(n) 122. An output v(n) 127 (comprised of quadrature signals) of the I/Q mismatch compensator 125 is provided to a zero-IF demodulator 130 that digitally demodulates the signal v(n) 127 to a digital baseband signal that is processed by a digital receiver 135. The digital receiver 135 performs, among other things, constellation decoding, error correction, de-framing, etc.

The I/Q mismatch compensator 125 of FIG. 1 computes the output signal v(n) 127 as a difference between the signal u(n) 122 and a filtered version of the signal u(n) 122. In the example of FIG. 1, the filtered version of the signal u(n) is formed as an output of a multiplication of a complex-conjugate of the signal u(n) 122 with a single complex-valued filter coefficient w(n). Thus, complex-valued output v(n) 127 can be expressed mathematically as shown in Equation 1.

$$v(n) = u(n) - w(n) \cdot u(n)^* \quad \text{(Equation 1)}$$

In Equation 1, $u(n) = u_I(n) + j \cdot u_Q(n)$ represents the complex-valued signal u(n) 122, j is equal to $\sqrt{-1}$, $w(n) = w_I(n) + j \cdot w_Q(n)$ is the complex-valued filter coefficient, * represents the complex conjugate operator, n is an index into a plurality of complex-valued digital samples that make up the complex-valued signals u(n) 122 and v(n) 127, a subscript I represents an in-phase portion of a signal, and a subscript Q represents a quadrature portion of a signal.

The I/Q mismatch compensator 125 of FIG. 1 also includes an adaptive de-correlator 140 that adapts the filter coefficient w(n) to compensate for I/Q mismatch present in the signal u(n) 122 by minimizing gain and phase mismatches between I and Q portions of the signal v(n) 127 (i.e., the gain and phase mismatch between $v_I(n)$ and $v_Q(n)$). In particular, adaptation of w(n) can be expressed mathematically as shown in Equations 2 and 3.

$$w_I(n+1) = w_I(n) + \mu \cdot (v_I(n)^2 - v_Q(n)^2) \quad \text{(Equation 2)}$$

$$w_Q(n+1) = w_Q(n) + 2 \cdot \mu \cdot v_I(n) \cdot v_Q(n) \quad \text{(Equation 3)}$$

In Equations 2 and 3, μ is an adaptation step-size, a subscript I represents an in-phase portion of a signal, and a subscript Q represents a quadrature portion of a signal. Equation 2 recognizes that I/Q gain mismatch appears as a difference in the signal power between the I and Q portions. In other words, when the power of the in-phase component is equal to the power of the quadrature component, the next value of $w_I$ will be identical to the current value of $w_I$. Equation 3 represents the fact that I/Q phase mismatch appears as a non-zero cross-correlation between the I and Q portions. In other words, when the cross-correlation of the in-phase and quadrature components is zero, the next value of $w_Q$ will be identical to the current value of $w_Q$.

I/Q mismatch present in a quadrature receiver can vary over time with ambient temperature, frequency of the received signal, and analog gain present in the quadrature receiver, etc. As discussed above, I/Q mismatch manifests itself as an unwanted frequency or signal image and, in the presence of strong interferers adjacent to the desired signal, can result in degraded receiver performance.

The example discussed above in connection with FIG. 1 uses least mean squares (LMS) techniques to adapt the filter coefficient w(n) to compensate for I/Q mismatch present in the signal u(n) 122. It has been recognized that when LMS adaptation is performed simultaneously with actual data reception that the LMS adaptation process may introduce undesired artifacts prior to convergence of the LMS adaptation. Such artifacts may be particularly problematic in situations requiring fast convergence or re-convergence and can lead to instability in the LMS adaptation. Even with a small adaptation step-size (that results in slow re-convergence), a partially adapted filter coefficient may perform I/Q mismatch compensation worse than a previously trained coefficient or a fully re-converged filter coefficient.

In FIG. 1, and in subsequent figures, a signal that includes both the I and the Q portions of the signal is illustrated using a heavy (i.e., bold) line (for example the signal 127 in FIG. 1).

When referring to such signals in associated discussions, it is assumed that both portions are included unless explicitly noted. Further, a subscript I represents an in-phase portion of a signal, a subscript Q represents a quadrature portion of a signal, and unless necessary for clarity, time indices for a plurality of digital samples are dropped. For example, the signal 122 is denoted by u, which refers to $u(n)=u_I(n)+j \cdot u_Q(n)$.

BRIEF DESCRIPTION OF THE DRAWINGS

FIG. 1 is a block diagram illustration of a portion of an example prior-art low-IF quadrature receiver.

FIG. 2 is a block diagram illustration of a portion of a disclosed example low-IF quadrature receiver.

DETAILED DESCRIPTION

Figure 3:
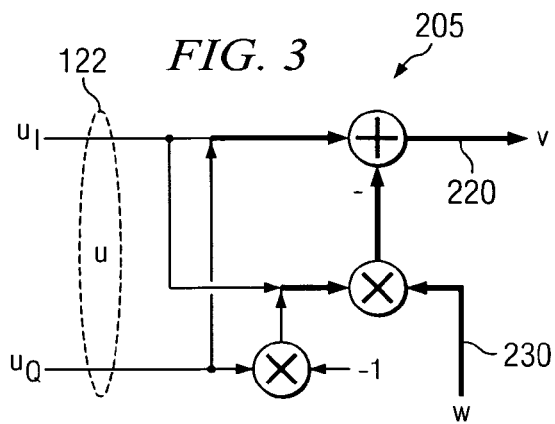
FIG. 3 is a block diagram illustration of a disclosed example manner of implementing the correction engine of FIG. 2.

To alleviate poor I/Q mismatch compensation performance due to partially or poorly converged LMS adaptation, a portion of a disclosed example low-IF quadrature receiver 200 illustrated in FIG. 2 includes a correction engine 205, an adaptation engine 210, and a coefficient controller 215. In the disclosed example of FIG. 2 the correction engine 205 operates to compensate for I/Q mismatch present in the signal u(n) 122, while the adaptation engine 210 operates to adapt a complex-valued filter coefficient wA 235 based on I/Q mismatch present in the signal u(n) 122. The coefficient controller 215 selectively updates the coefficient used by the correction engine 205.

As described in detail below, the correction engine 205 uses a complex-valued filter coefficient w 230 that is provided to the correction engine 205 by the coefficient controller 215 and is occasionally adjusted to be substantially equal to the filter coefficient wA 235 at the instant the filter coefficient w 230 is adjusted. The correction engine 205 computes an output signal 220 as a difference between the signal u 122 and a filtered version of the signal u 122 that is formed as an output of a multiplication of a complex-conjugate of the signal u 122 with the filter coefficient w 230.

The adaptation engine 210 adapts the filter coefficient wA 235 to minimize gain and phase mismatches between I and Q portions (i.e., real and imaginary parts) of signal vA 225 (see FIG. 4) by recognizing that I/Q gain mismatch appears as a difference in the signal power between the I and Q portions, and I/Q phase mismatch appears as a non-zero cross correlation between the I and Q portions.

In the disclosed example quadrature receiver 200 of FIG. 2 the coefficient controller 215 receives from the adaptation engine 210 the current filter coefficient wA 235 and provides to the correction engine 205 the current filter coefficient w 230. Further, the coefficient controller 215 uses one or more criteria and/or timing driven logic to determine when to adjust the filter coefficient w 230. For example, the coefficient controller 215 could track the performance of I/Q mismatch compensation resulting from use of the filter coefficient wA 235, and when better than the filter coefficient w 230 adjust the filter coefficient w 230 to be substantially equal to the filter coefficient wA 235. In one example, the coefficient controller 215 compares a difference between the filter coefficient w 230 and the filter coefficient wA 235, and if the difference is greater than a pre-determined threshold, then the coefficient controller 215 adjusts the filter coefficient w 230 to be substantially equal to the filter coefficient wA 230. The pre-determined threshold eliminates updates of the filter coefficient w 230 when such updates represent insignificant changes to the filter coefficient w 230. Such a method is particularly well suited for circumstances (e.g., during a data burst) where adaptation of the filter coefficient wA 235 sequentially improves I/Q mismatch compensation. In another example, the adaptation engine 210, coefficient controller 215, or the digital receiver 135 monitors the I/Q mismatch present in the signal vA 225. In particular, one or both of the difference in the signal power between the I and Q portions (i.e., I/Q gain mismatch) or the cross correlation between the I and Q portions (i.e., I/Q phase mismatch) could be monitored. If one or both of the difference or the cross correlation are decreasing over time, then the I/Q mismatch compensated by the filter coefficient wA 235 is improving over time.

Alternatively, the coefficient controller 215 could simply adjust the filter coefficient w 230 at the end of each received data burst. Further, the coefficient controller 215 could adjust the filter coefficient w 230 based on one or more signal quality metrics, for example, valid receive data, high signal-to-noise ratio (SNR), stable ambient temperature, etc. Finally, the coefficient controller 215 could avoid adjusting the filter coefficient w 230 when one or more conditions are present or occurring. For example, an ambient temperature change followed by a return to a previous ambient temperature, etc. In general, the filter coefficient w 230 is only adjusted to be substantially equal to the filter coefficient wA 235 when the filter coefficient wA 235 would provide some advantage over the filter coefficient w 230. It should be readily appreciated by persons of ordinary skill in the art that various other appropriate methods of determining when to adjust the filter coefficient w 230 could be used.

It should be readily apparent to persons of ordinary skill in the art, that the number of bits used to represent the filter coefficient w 230 and the filter coefficient wA 235 may be different. For example, because the adaptation engine 210 is adapting the filter coefficient wA 235 it may represent the filter coefficient wA 235 using additional bits to improve the performance of the LMS adaptation process. If the number of bits used to represent the two coefficients is different, then the coefficient controller 215 will perform appropriate adjustments, for example quantizing the filter coefficient wA 235 to a smaller number of bits used to represent the filter coefficient w 230.

The disclosed example of FIG. 2 includes a multiplexer 245 to allow the digital receiver 135 to select either outputs 220 of the correction engine 205 or outputs 225 of the adaptation engine 210. The multiplexer 245 allows the disclosed example of FIG. 2 to operate in a mode similar to that illustrated by the prior-art example of FIG. 1, or to operate with separate correction 205 and adaptation 210 engines as discussed herein. As described below in connection with FIGS. 5 and 7, the digital receiver 135 may provide control inputs to the adaptation engine 210 and the coefficient controller 215, and can provide filter coefficients (not necessarily computed by the adaptation engine 210) to the coefficient controller 215. Further, the coefficient controller 215 provides to the adaptation engine 210 a third coefficient 240 that substantially equals either a filter coefficient provided by the digital receiver 135, or the current filter coefficient wA 235 previously provided by the adaptation engine 210 to the coefficient controller 215.

FIG. 3 illustrates a disclosed example manner of implementing the correction engine 205 of FIG. 2. The example correction engine 205 of FIG. 3 computes the complex-valued output signal v 220 that is a difference between the signal u 122 and a filtered version of the signal u 122. In the example of FIG. 3, the filtered version of the signal u is formed as an output of a multiplication of a complex-conjugate of the signal u 122 with a single complex-valued filter coefficient w 230. The operation of the example correction engine 205 of FIG. 3 can be expressed mathematically as $$v = u - w \cdot u^*, \quad \text{(Equation 4)}$$

where w is the first filter coefficient w 230.

Figure 4:
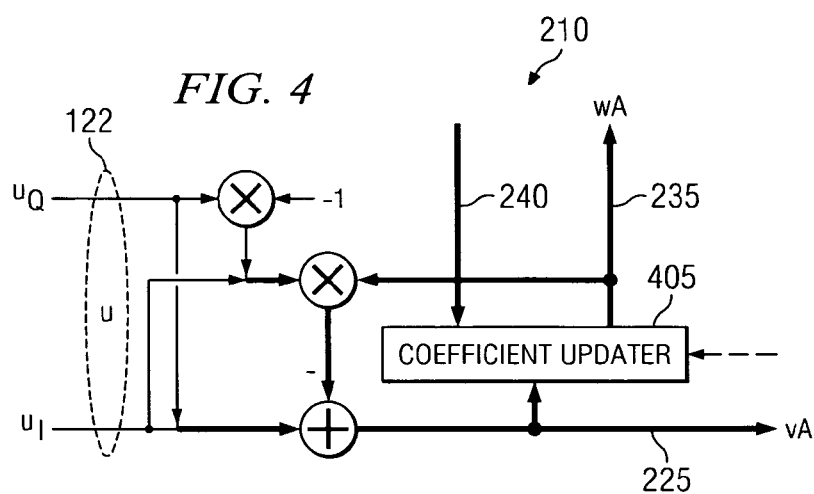
FIG. 4 is a block diagram illustration of a disclosed example manner of implementing the adaptation engine of FIG. 2

FIG. 4 illustrates a disclosed example manner of implementing the adaptation engine 210 of FIG. 2 including a one-tap complex filter and a coefficient updater 405. Similar to the example correction engine 205 of FIG. 3, an output vA 225 of the example adaptation engine 210 of FIG. 4 can be expressed mathematically as $$vA = u - wA \cdot u^*, \quad \text{(Equation 5)}$$

where wA is the filter coefficient wA 235. The coefficient updater 405 adapts the filter coefficient wA 235 to compensate for I/Q mismatch present in the quadrature signal u 122. Like the adaptive de-correlator 140 discussed above in connection to FIG. 1, the adaptation of the filter coefficient wA 235 can be expressed mathematically as shown in Equations 6 and 7. Equation 6 represents correction for gain mismatch and Equation 7 represents correction for phase mismatch.

$$wA_I(n+1) = wA_I(n) + \mu \cdot (vA_I(n)^2 - vA_Q(n)^2) \quad \text{(Equation 6)}$$

$$wA_Q(n+1) = wA_Q(n) + 2 \cdot \mu \cdot vA_I(n) \cdot vA_Q(n) \quad \text{(Equation 7)}$$

It will be apparent to persons of ordinary skill in the art that the example manner of implementing the adaptation engine 210 of FIG. 2 could also be used to implement the correction engine 205 of FIG. 2. In particular, by disabling coefficient updates (as discussed below in connection with FIG. 6), the example manner of FIG. 4 can provide an output signal vA 225 that is substantially equal to the output signal v 220 of the example manner illustrated in FIG. 3.

Figure 5:
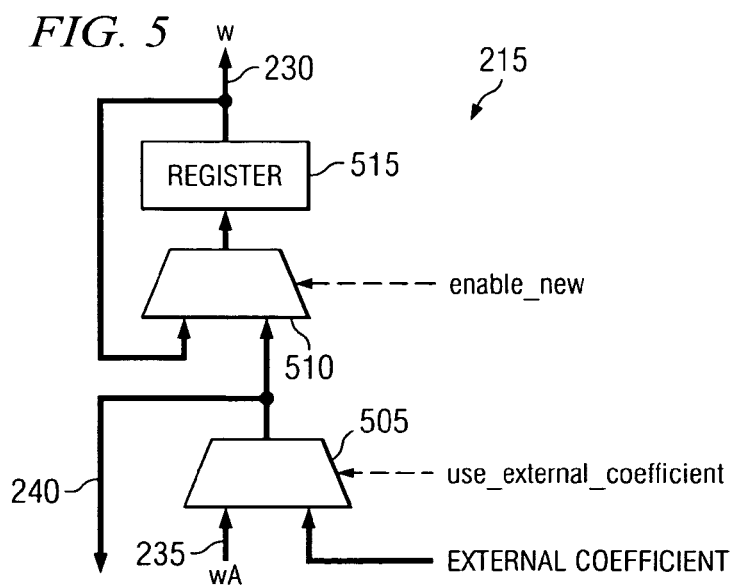
FIG. 5 is a block diagram illustration of a disclosed example manner of implementing the coefficient controller of FIG. 2.

FIG. 5 illustrates a disclosed example manner of implementing the coefficient controller 215 of FIG. 2 that includes two multiplexers 505 and 510, and a register 515. The two multiplexers 505 and 510 are controlled by the digital receiver 135 of FIG. 2. In particular, the digital receiver 135 controls the multiplexer 505 to select as an output either the filter coefficient wA 235 or an external coefficient provided by the digital receiver 135. Likewise, the digital receiver 135 controls the multiplexer 510 to select either an output of the multiplexer 505 or the filter coefficient w 230. Control of the two multiplexers 505 and 510 allows the digital receiver 135 to control when the filter coefficient w 230 is adjusted to be substantially equal to the filter coefficient wA 235 or the external coefficient.

Figure 6:
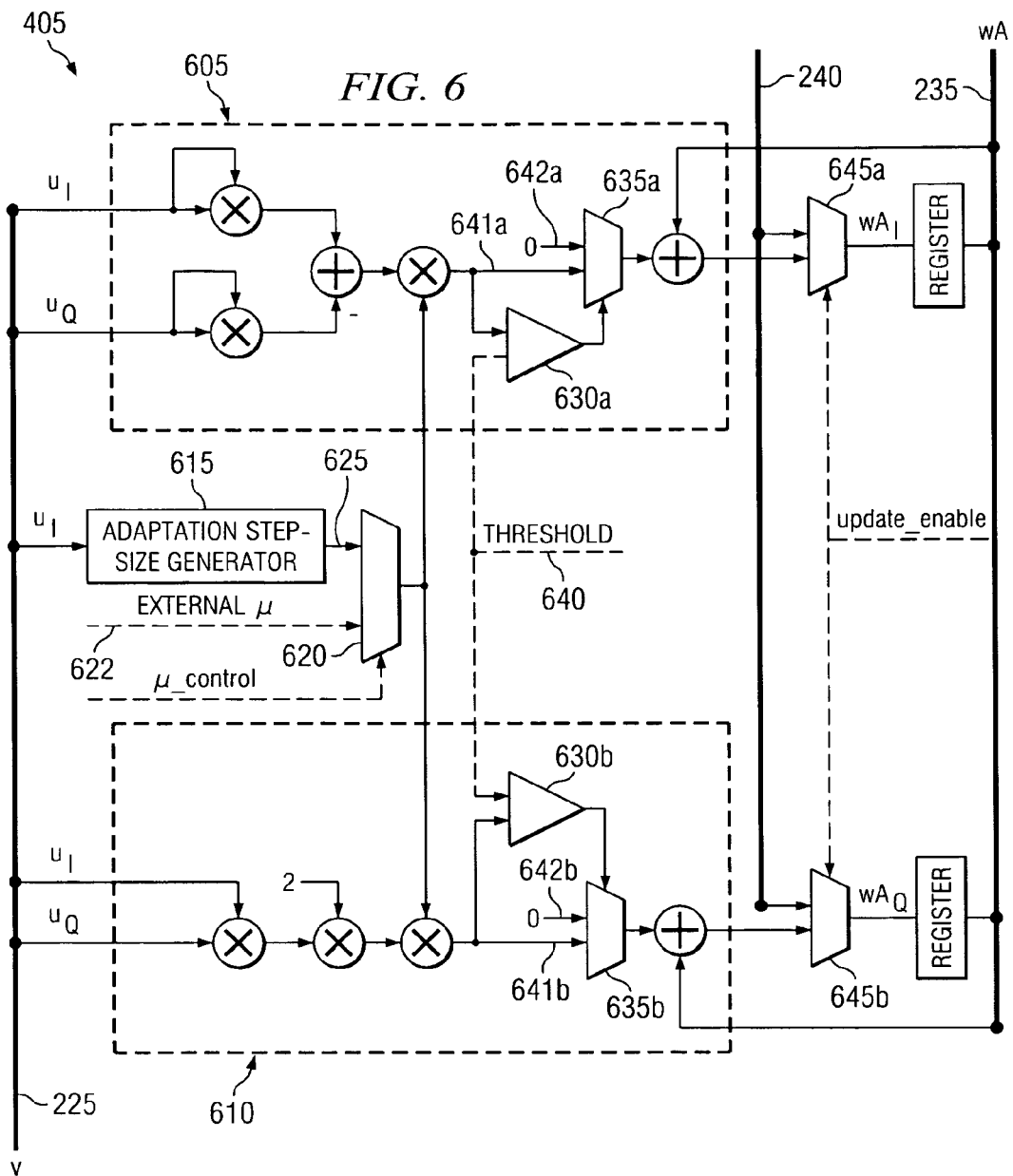
FIG. 6 is a block diagram illustration of a disclosed example manner of implementing the coefficient updater of FIG. 4.

FIG. 6 illustrates a disclosed example manner of implementing the coefficient updater 405 of FIG. 4. A plurality of multipliers and adders contained in a box 605 in the example of FIG. 6 implement the update of $wA_I$ expressed mathematically above in Equation 6. Likewise, a second plurality of multipliers and an adders contained in a box 610 implement the update of $wA_Q$ expressed mathematically above in Equation 7. It should be readily appreciated by those of ordinary skill in the art that fewer multipliers and adders could implement the functionality shown in the boxes 605 and 610. For example, a single multiplier could be time multiplexed to implement all six of the multipliers illustrated in FIG. 6.

To determine the adaptation step-size $\mu$, the coefficient updater 405 includes adaptation step-size generator 615 and a multiplexer 620. The multiplexer 620 in the example manner of FIG. 6 allows the digital receiver 135 of FIG. 2 to provide and select (by controlling the multiplexer 620) an adaptation step-size $\mu$ 622. As described below in conjunction with FIG. 7, the adaptation step-size generator 615 determines based upon the input signal $u_I$ 122 an appropriate adaptation step-size $\mu$ 625. It should be readily apparent to persons of ordinary skill in the art, that the adaptation step-size generator 615 could use the input signal $U_Q$ 122 to determine the adaptation step-size $\mu$ 625.

The example of FIG. 6 includes comparators 630a and 630b, and multiplexers 635a and 635b that allow the digital receiver 135 of FIG. 2 to set and control a maximum value for a change in $wA_I$ and $wA_Q$. For example, the comparator 630a compares the change in the value of $wA_I$ 641a with a threshold 640, and if the change in value of $wA_I$ 641a is more than the threshold 640 then the multiplexer 635a selects an input 642a that takes on a value of zero, that means no update in value of $wA_I$, rather than selecting the change in value of $wA_I$ 641a. Likewise, the comparator 630b compares the change in value of $wA_Q$ 641b with the threshold 640, and if the updated value of $wA_Q$ 641b is more than the threshold 640 then the multiplexer 635b selects an input 642b that takes on a value of zero rather than selecting the change in value of $wA_Q$ 641b.

The disclosed example manner of FIG. 6 further includes multiplexers 645a and 645b that allow the digital receiver 135 of FIG. 2 to enable or disable adaptation of the filter coefficient wA 235. For example, if inputs 240 (i.e., third filter coefficient 240 provided by the coefficient controller 215 to the adaptation engine 210) of the multiplexers 645a and 645b are selected, then any update determined by the coefficient updater 405 is discarded. Further, the digital receiver 135 can set an initial filter coefficient wA 235 by disabling adaptation in the coefficient updater 405, setting a new coefficient in the coefficient controller 215, and then enabling adaptation in the coefficient updater 405.

If less functionality is desired in the coefficient updater 405, it should be readily appreciated by those of ordinary skill in the art that one or more of the multiplexers 620, 635a, 635b, 645a, 645b, the comparators 630a and 630b, and/or the adaptation step-size generator 615 could be removed from the example of FIG. 6, while still preserving the ability of the disclosed example quadrature receiver 200 of FIG. 2 to overcome aforementioned problematic aspects of prior art I/Q mismatch compensation techniques.

Figure 7:
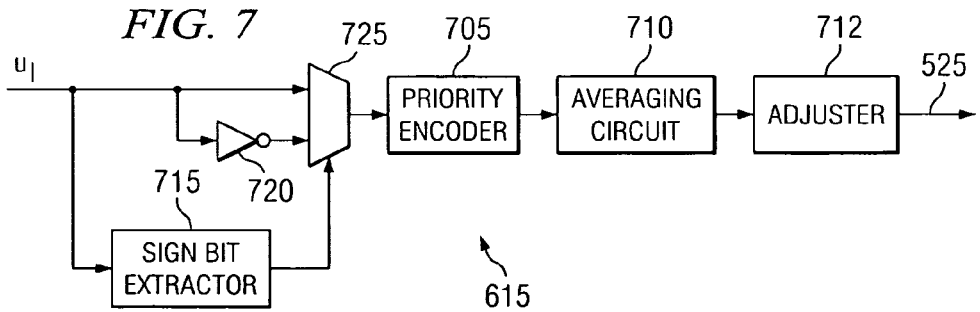
FIG. 7 is a block diagram illustration of a disclosed example manner of implementing the adaptation step-size generator of FIG. 5.

In any adaptive system, the adaptation step-size $\mu$ 625 affects tracking and stability properties of the system. To ensure stability, the adaptation step-size $\mu$ 625 must be chosen such that $0<\mu<2/\sigma^2$, where $\rho^2$ is the variance of the input signal u 122. FIG. 7 illustrates a disclosed example manner of implementing the adaptation step-size generator 615 of FIG. 5 that includes a priority encoder 705, an averaging circuit 710, an adjuster 712, a sign bit extractor 715, an inverter 720 and a multiplexer 725. In the example manner of FIG. 7 the $L_1$-norm power (i.e., a sum of absolute values) is used as an estimate of $1/\rho^2$. To compute the $L_1$-norm power, adaptation step-size generator 615 passes the absolute value of the input signal $u_I$ (or $u_Q$) through the priority encoder 705 that looks for the first non-zero bit (starting from the most significant bit (MSB)) and then assigns it a 4-bit code. The averaging circuit 710 then performs an average over a plurality of the 4-bit codes (e.g., sixty-four 4-bit code) forming an estimate of the $L_1$-norm power. Finally, the adjuster 712 adjusts the estimated $L_1$-norm power to form the adaptation step-size $\mu$ 625. For example, the adjuster 712 subtracts a constant (e.g., 13) from the estimated $L_1$-norm power to reduce the adaptation step-size $\mu$ 625 somewhat, and then quantizes the scaled $L_1$-norm power to a number representable as a power of 2. To compute the absolute value of the input signal $u_I$, the sign bit extractor 715 extracts the sign bit of the input signal $u_I$ and the extracted sign bit is used to control the multiplexer 725 to select either the input signal $u_I$ or the output of the inverter 720. It should be readily appreciated by those of ordinary skill in the art that alternative methods of determining the adaptation step-size $\mu$ 625 could be used.

Figure 8:
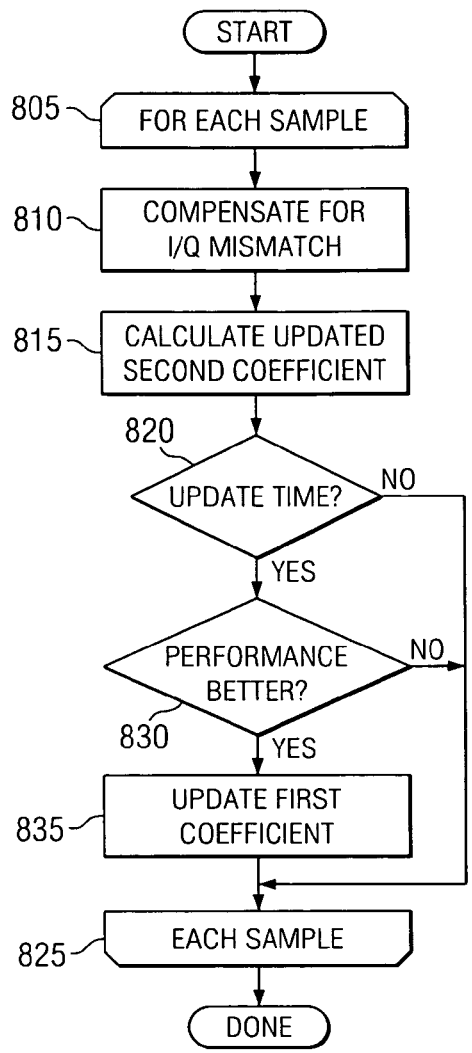
FIG. 8 is a flow chart illustrating a disclosed example process that may be executed by the disclosed example low-IF quadrature receiver of FIG. 2.
Figure 9:
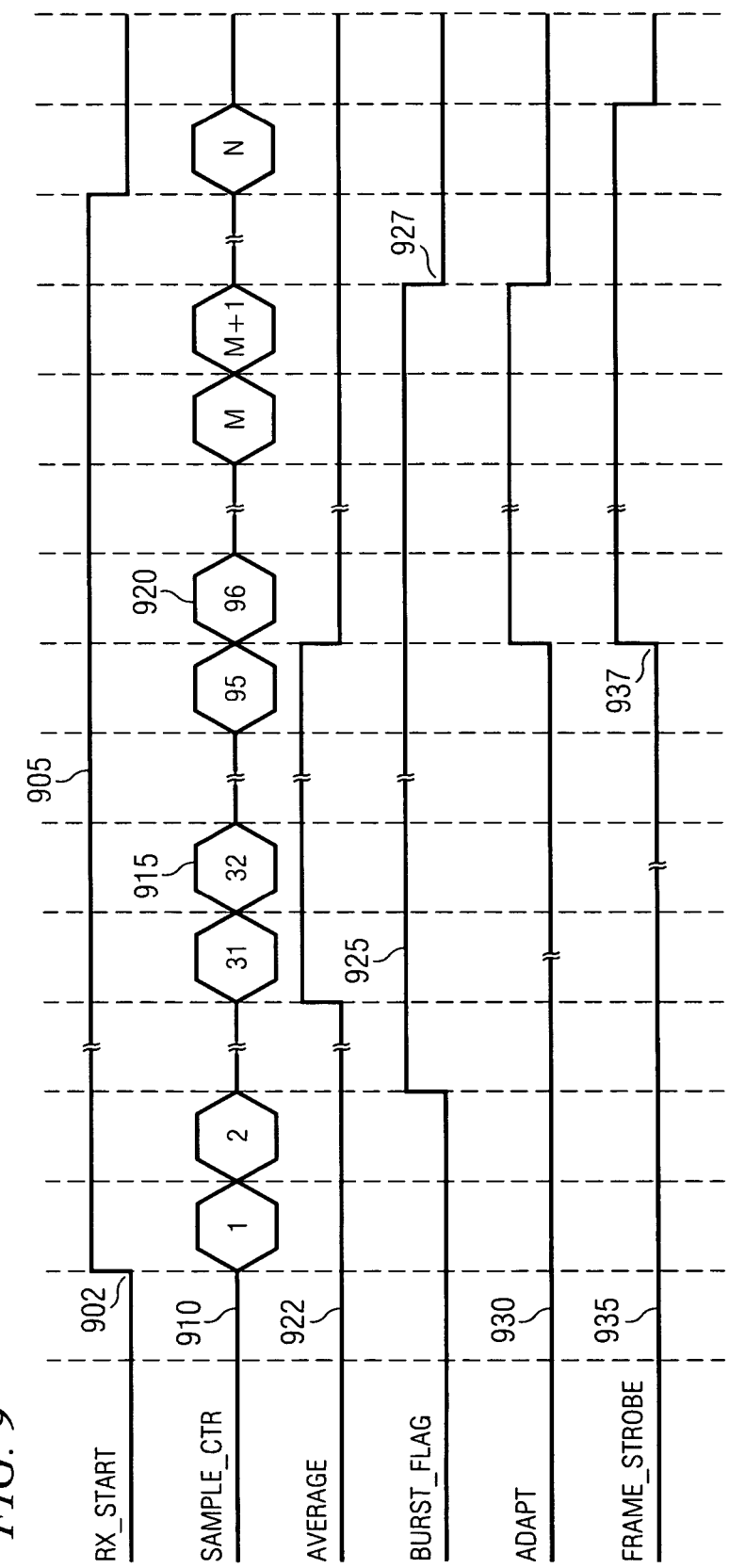
FIG. 9 is a timing diagram illustrating an example behavior of the disclosed example low-IF quadrature receiver of FIG. 2.

FIG. 8 illustrates a flowchart representative of an example process that may be carried out by the example low-IF quadrature receiver 200 of FIG. 2. FIG. 9 shows example timing for the quadrature receiver 200 of FIG. 2. The example process of FIG. 8 and the example timing of FIG. 9 may be implemented using machine readable instructions that are executed by a controller, a processor such as a digital signal processing (DSP) core 1010 shown in an example DSP 1000 discussed below in connection with FIG. 10, or any other suitable computing device.

For example, the process or behavior may be embodied in coded instructions stored on a tangible medium such as a CD-ROM, a floppy disk, a hard drive, a digital versatile disk (DVD), or a memory associated with the processor 1010, but persons of ordinary skill in the art will readily appreciate that the entire behavior or process and/or parts thereof could alternatively be executed by a device other than the processor 1010 and/or embodied in firmware or dedicated hardware in a well known manner. For example, any or all of the correction engine 205, the adaptation engine 210, the coefficient controller 215, and/or the digital receiver 135 could be implemented using software, hardware, and/or firmware.

Further, although the examples are described with reference to the example flowchart illustrated in FIG. 8 and the example timing of FIG. 9, persons of ordinary skill in the art will readily appreciate that many other methods of implementing the example quadrature receiver 200 of FIG. 2 may be used. For example, the order of execution of the blocks may be changed, and/or some of the blocks described may be changed, eliminated, or combined.

The example process of FIG. 8 begins with a looping block 805 that processes each sample of the input quadrature signal u 122. As described above, the example process compensates for I/Q mismatch present in an input sample using the first filter coefficient w 230 (block 810) and calculates an updated second filter coefficient wA 235 (block 815). The example process of FIG. 8 could use the correction engine 205 of FIG. 2 to compensate for I/Q mismatch present in the input sample, and the adaptation engine 210 of FIG. 2 to update the second filter coefficient wA 235. Next, the process checks to see if it is an appropriate time (e.g., the end of a data burst, or some other point in time) to update the first filter coefficient w 230 (block 820). The example process then determines if the second filter coefficient wA 235 provides better I/Q mismatch compensation (block 830) than the first filter coefficient w 230. For example (as discussed above), by determining if one or both of the difference in the signal power between the I and Q portions (i.e., I/Q gain mismatch) or the cross correlation between the I and Q portions (i.e., I/Q phase mismatch) are decreasing over time. If the second filter coefficient wA 235 provides better I/Q mismatch and it is time to update the first filter coefficient w 230, the process adjusts the first filter coefficient w 230 to be substantially equal to the second filter coefficient wA 235 (block 835). At looping block 825, the process loops back to looping block 805 to process the next sample of the input signal u 122.

Alternatives to the example program of FIG. 8 should be readily apparent to persons of ordinary skill in the art. For example, using only a single decision block that uses a criteria based on input signal quality, using only a single decision block that uses a criteria based on stable ambient temperature, including a third decision block that uses a criteria based on stable ambient temperature, etc.

Over received data bursts, the quality (e.g., SNR) of received signals may be good. Under such circumstances, adaptation of the second filter coefficient wA 235 performed during a data burst results in an updated second filter coefficient wA 235 that compensates better for I/Q mismatch than the second filter coefficient wA 235 at the start of the data burst. Thus, the example process of FIG. 8 could simply update the first filter coefficient w 230 at the end of each data burst and not verify the performance of the second filter coefficient wA 235 (i.e., skip decision block 830).

FIG. 9 shows example timing for the quadrature receiver 200 that adjusts the first filter coefficient w 230 at an end of each received data burst. The start of a data burst is signified by the rising edge 902 of a RX_START signal 905. The rising edge 902 of the RX_START signal 905 starts a sample counter 910 that counts each received sample of the input signal u 122. In the example behavior the adaptation step-size generator 615 waits until the $32^{nd}$ sample 915 to start the averaging circuit 710 to avoid any signals that may belong to a previous data burst.

The adaptation step-size generator 615 then computes the average over 64 samples as illustrated by the AVERAGE signal 922. As illustrated by the ADAPT signal 930, starting with the $96^{th}$ sample 920 the adaptation engine 210 adapts the second filter coefficient wA 235. Adaptation of the second filter coefficient wA 235 concludes on the falling edge 927 of a BURST_FLAG signal 925 that signifies the end of the data burst. Upon stopping the adaptation of the second filter coefficient wA 235, the coefficient controller 215 adjusts the first filter coefficient w 230 to be substantially equal to the second filter coefficient wA 235. In the example low-IF quadrature receiver 200 of FIG. 2, the averaging circuit 710 of FIG. 6 provides a FRAME_STROBE signal 935 with a rising edge 937 occurring coincident with the conclusion of the averaging process, and the ADAPT signal 930 is formed as the logical AND of the BURST_FLAG signal 925 and the FRAME_STROBE signal 935.

Figure 10:
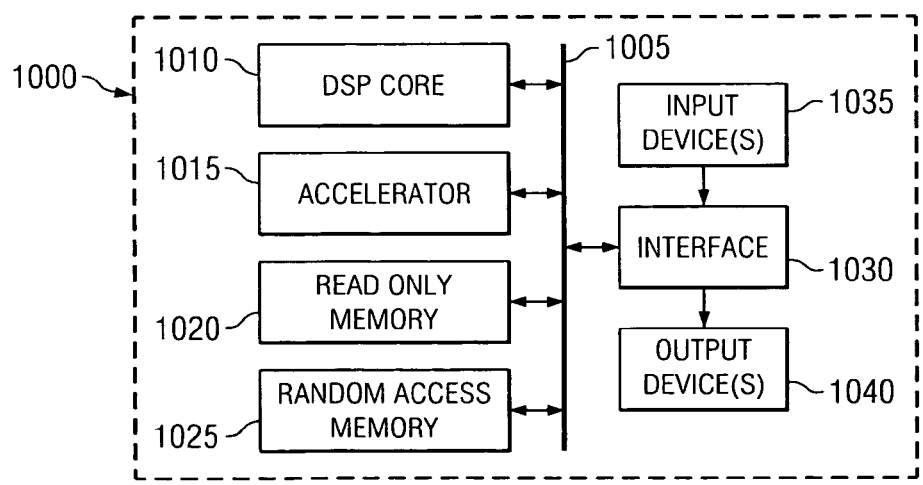
FIG. 10 is a block diagram illustration of a disclosed example digital signal processor that may realize the example behavior of FIG. 8 or the example process of FIG. 9 to implement the quadrature receiver of FIG. 2.

FIG. 10 is a block diagram of an example DSP 1000 capable of implementing the apparatus and methods disclosed herein. For example, the DSP 1000 can be implemented by one or more digital signal processors (e.g., TMS320C54x™, TMS320C6x™, OMAP™) from Texas Instruments Incorporated, or other devices from other manufacturers.

The DSP 1000 of the instant example includes the DSP core 1010. The DSP core 1010 is a general purpose programmable processor with enhancements making it more suitable for real-time processing of digital signals. The DSP core 1010 executes coded instructions present in main memory of the DSP 1000. The DSP core 1010 may implement, among other things, the digital receiver 135 and/or the coefficient controller 215.

The DSP core 1010 is in communication with the main memory including a read only memory (ROM) 1020 and a random access memory (RAM) 1025 via a bus 1005. The RAM 1025 may be implemented by Synchronous Dynamic Random Access Memory (SDRAM), Dynamic Random Access Memory (DRAM), RAMBUS Dynamic Random Access Memory (RDRAM) and/or any other type of random access memory device. The ROM 1020 may be implemented by flash memory and/or any other desired type of memory device. Access to the main memory 1020, 1025 is typically controlled by a memory controller (not shown) in a conventional manner.

To reduce the computational burden of the DSP core 1010, the DSP 1000 provides an accelerator 1015. The accelerator 1015 contains dedicated circuits and hardware to implement specific data manipulation and/or signal processing. The accelerator 1015 may implement, among other things, the digital filters 120, the correction engine 205, the adaptation engine 210, and/or the zero-IF demodulator 130.

The DSP 1000 also includes a conventional interface circuit 1030. The interface circuit 1030 may be implemented by any type of well known interface standard, such as an external memory interface (EMIF), serial port, general purpose input/output, etc.

One or more input devices 1035 are connected to the interface circuit 1030. The input device(s) 1035 (e.g., the analog receiver 115) may be used to provide the DSP core 1010 input data and signals to be processed.

One or more output devices 1040 are also connected to the interface circuit 1030. The output devices 1040 (e.g., digital to analog converters, data buffers, external memory, etc.) may be used by the DSP core 1010 to provide processed output data and signal to external devices.

From the foregoing, persons of ordinary skill in the art will appreciate that the above disclosed methods and apparatus may be realized within a single device or across two cooperating devices, and could be implemented by software, hardware, and/or firmware to implement the improved wireless receiver disclosed herein.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A low-IF quadrature receiver comprising:
    A. an antenna for receiving a radio frequency signal;
    B. a RF receiver having an input connected to the antenna and outputs carrying quadrature analog IF signals;
    C. an analog receiver having inputs connected to the outputs of the RF receiver and having outputs carrying quadrature digital IF band signals;
    D. digital filters having inputs connected to the outputs of the analog receiver and having outputs carrying in-phase and quadrature components of quadrature signals;
    E. a correction engine having inputs connected to the outputs of the digital filters, a complex-valued filter coefficient w input, and a v output;
    F. a coefficient controller having a complex-valued filter coefficient w output connected with the complex-valued filter coefficient w input, a complex-valued filter coefficient wA input, and a third coefficient output;
    G. an adaptation engine having inputs connected with the outputs of the digital filters, a complex-valued filter coefficient wA output connected with the complex-valued filter coefficient wA input, and a third coefficient input connected with the third coefficient output, the adaptation engine including a vA output; and
    H. a multiplexer having one input connected with the v output, another input connected with the vA output, and a v(n) output;
    and wherein the outputs of the digital filters include u outputs carrying in-phase $u_I$ and quadrature $u_Q$ components of the quadrature signals, the adaptation engine produces a complex-valued filter coefficient wA signal on the complex-valued filter coefficient wA output in response to a difference in signal power between the $u_I$ and $u_Q$ components of the quadrature signals.

2. The receiver of claim 1 in which the coefficient controller has an external coefficient input, and including:
    A. the multiplexer having a control input;
    B. demodulator circuitry having an input connected with the output of the multiplexer and an output; and
    C. digital receiver circuitry having an input connected with the output of the demodulator circuitry, an external coefficient output connected with the external coefficient input, an a control input connected with the control input of the multiplexer.

3. The receiver of claim 1 in which the coefficient controller has an external coefficient input and a control input, the adaptation engine includes a control input, and including:
    A. the multiplexer having a control input;
    B. demodulator circuitry having an input connected with the output of the multiplexer and an output; and
    C. digital receiver circuitry having an input connected with the output of the demodulator circuitry, an external coefficient output connected with the external coefficient input, a first control output connected with the control input of the multiplexer, a second control output connected with the control input of the coefficient controller, and a third control output connected with the control input of the adaptation engine.

4. The receiver of claim 1 in which the outputs of the digital filters include u outputs carrying in-phase and quadrature components of quadrature signals, and the correction engine producing the v output according to the following equation:

$$v = u - w \cdot u^*.$$

5. The receiver of claim 1 in which the outputs of the digital filters include u outputs carrying in-phase and quadrature components of quadrature signals, the adaptation engine includes a vA output, and the adaptation engine producing the vA output according to the following equation:

$$vA = u - wA \cdot u^*.$$

6. The receiver of claim 1 including a digital signal processor implementing the coefficient controller.

7. The receiver of claim 1 including a digital signal processor implementing the coefficient controller, and accelerator circuitry implementing the correction engine and the adaptation engine.

* * * * *